United States Patent
Dutta (10) Patent No.: US 7,561,006 B2
(45) Date of Patent: Jul. 14, 2009

(54) LOW LOSS ELECTRICAL DELAY LINE

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 177 days.

(21) Appl. No.: 11/467,536

(22) Filed: Aug. 25, 2006

(65) Prior Publication Data
US 2008/0048800 A1   Feb. 28, 2008

(51) Int. Cl.
- *H01P 1/18* (2006.01)
- *H01P 3/08* (2006.01)
- *H01P 9/00* (2006.01)

(52) U.S. Cl. .................... 333/161; 333/156; 333/238
(58) Field of Classification Search ............ 333/156, 333/161, 238, 246
See application file for complete search history.

(56) References Cited

U.S. PATENT DOCUMENTS

| | | | | |
|---|---|---|---|---|
| 5,105,055 A | * | 4/1992 | Mooney et al. | 174/27 |
| 6,989,788 B2 | * | 1/2006 | Marion et al. | 342/375 |
| 2003/0146808 A1 | * | 8/2003 | Merrill | 333/161 |
| 2004/0173822 A1 | * | 9/2004 | Dutta | 257/208 |

* cited by examiner

*Primary Examiner*—Anh Q Tran (57) ABSTRACT

A delay line system able to reduce the microwave loss by reducing the effective dielectric loss and dielectric constant of the system including a signal line, dielectric system with opened trench or slot filled up with the air or lower dielectric loss material, a ground plane, and a system of switches if the line is to be variable. The delay line proposed in this invention could be made of any type of signal line configuration, for example: micro-strip line, strip line, or coplanar line. The signal line can also be made as single ended or differential pairs of any configurations. The delay line systems based on the fundamental techniques provided in this invention can be used for on-chip devices where the delay line is laid on the oxide or dielectric material, or in a traditional PCB implementation such as FR4.

25 Claims, 11 Drawing Sheets

Prior Art

FIG. 1

Prior Art

FIG. 8A
Delay Line Layout: An example

Y = W + 10 %
r = 0.1 mm
rr = r + W/2
Length of bend (e) = ($\pi \ast rr$)/2

Fig. 8B
Delay Line Layout: An example

FIG. 8C Delay Line Layout: An example

FIG. 8D Design of 8* Lambda Delay Line for 10 GHz: An example

FIG. 9: Insertion Losses and lengths for various dielectric constants

FIG. 10: Insertion losses @ 10GHz and 20GHz frequencies

FIG. 11A : Tunable Delay-line: An Example

FIG. 11B : Tunable Delay-line: A section

FIG. 11C : Tunable Delay-line: Alternate Example

Table 1: Comparing delay-line performance made from conventional and proposed techniques

| Time-delay Types | $S21^i$ (dB) | | | $S11^i$ (dB) |
|---|---|---|---|---|
| | s/w | Line | Total | |
| Modified FR4 | 4 | 1.95 | < 6 | < 35 |
| FR4 | 4 | 8 | 12 | < 50 | i= 0,1,2,...,15

FIG. 12A : Fabrication of On-Chip Delay-Line with microstrip line structure

FIG. 12B : Fabrication On-Chip Delay-Line with Coplanar waveguide Structure

FIG. 12C : Schametic showing the monolithic RF system integrated with on-chip low loss delay line

LOW LOSS ELECTRICAL DELAY LINE

CROSS REFERENCE TO RELATED APPLICATIONS

This patent application is related to U.S. patent application Ser. Nos. 10/793,576, and 10/793,363 filed concurrently herewith and entitled "High speed interconnects and manufacturing" which is hereby incorporated by reference herein in its entirety.

FIELD OF THE INVENTION

The present invention relates to achieving low loss delay lines (mentioned as also "Phase-Shifter") by creating a trench, made of either an air gap or a material with a lower value dielectric than the core dielectric material, within the core dielectric material. It is used best in systems which require a shift in phase or a signal delay.

BACKGROUND OF THE INVENTION

Delay-Lines with attributes of low insertion loss, low cost, high power signal handling, and which are variable are desired for numerous microwave applications. Especially, in modern high frequency radar and communication systems, the antenna pattern must be moved at very rapid rates and this is normally achieved in phase-array antennas through the use of a matrix of small radiator elements whose radiation phases are systematically and electronically varied. The necessary phase gradients across the antenna are usually generated in discrete steps by a plurality of such electronic phase shifter elements. This application system requires phase shifter which has low insertion loss, variable, and can deal with high signal.

State-of-art delay lines are based on active device technologies such as Field-Effect Transistor (FET) and P-I-N diode; however, these are not capable of providing all the desired attributes mentioned earlier because the transistor fabrication process (MMIC) is costly and requires high resolution.

Currently, it is possible to make a passive delay line using a transmission-line structure and conventional dielectrics. This passive delay line can be made tunable using switches. The primary drawbacks concerning this type of delay line are: the insertion loss is dominated by the dielectric materials and a longer delay time further increases the insertion loss. Insertion loss can be minimized if a low loss tangent dielectric material is used. However, under current technologies the cost of the low loss tangent dielectrics is sufficiently high to limit their usage to high-end systems.

Prior art disclosed in U.S. Pat. No. 5,495,211, the capability of delay line for steering the beam in RF system uses the reconfigurable transmission line in which plurality of excitation beam/sources are used to change the conductivity to reconfigure the transmission line property. Using of the excitation beams would require the additional power to function the delay line requiring desired signal delay would not disadvantages for the RF systems.

In U.S. Pat. No. 4,603,310, the disclosed low insertion loss phase shifter (delay line) which uses a pair of diodes, connected back to back between the input and output of the circuit. A parallel resonant circuit made from an inductor in parallel with a capacitor and combination are series with a diode, is arranged at the common junction between the back to back diodes. As this structure is made of diodes and not suitable for dealing with the high input of signal, Therefore, it is highly desirable to have delay lines that are passive and can offer characteristics such as: (i) low insertion loss, (ii) compact in size, and (iii) low cost. Additionally, it is desirable to have delay lines which have high signal handling capability and are tunable, yet cost-effective and friendly for manufacturing.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

SUMMARY OF THE INVENTION

The invention is an implementation of low loss delay lines in both static and variable configurations. This low loss is achieved by creating a trench or backside slot, made of either an air gap or a material with a lower value dielectric loss/constant than the core dielectric material, within the core dielectric material, under the signal line in order to reduce the effective loss-tangent and effective dielectric constant. This technique results in better performance characteristics than the traditional configuration, which is described within. Other peripheral benefits can be achieved by choosing a dielectric system that has cooling effects or the ability to be controlled and/or varied during operation. Using coolant (gas, liquid etc.) in the trench helps to reduce the heat induced due to the absorption of the signal.

This invention can be used in Radio-Frequency (RF) radar systems, phased array antenna systems, communication systems, and generally in any system where signals are to be delayed and/or created in phase. The most significant application is within an electronically steerable phased array antenna, in which the phase of a large number of radiating elements is controlled in order to force the electromagnetic wave to add up to form a particular angle with the array.

The invention is a novel delay line technology that will decrease the dielectric loss such that a signal will be transmitted at a much higher frequency. This delay line is passive device. For example, if this high performance passive delay line is used with standard PCB material e.g. FR4 (Trade Name), the estimated loss at 20 GHz at the end of 12 inches is only 2 dB for 70% of trench height with respect to the total height of the substrate; whereas, a 12 inch long state-of-art delay line in standard FR4 based PCB at 20 GHz will have more tha 9 dB of signal loss. This low loss allows standard single ended signaling without equalization or clock and data recovery, hence providing a simplified delay line solution. This delay line can be greatly simplified for microwave delay lines and can be of help when designing tunable delay lines utilizing low-cost FR4 PCB material. Alternatively, this delay line can be also fabricated monolithically on the semiconductor substrate and integrated with other active devices to increase the functionality and also make variable delay line incorporating with other devices such as switches.

BRIEF DESCRIPTION OF FIGURES

In the following description, the same reference numerals denote components having substantially the same functions and arrangements, and duplicate explanation will be made only where necessary. The invention will be explained in more detail in conjunction with the appended drawings wherein.

FIG. 4B shows an additional dielectric layer 107, which may or may not be the same as either of the other said dielectric materials 104 or 105.

FIG. 5B shows said additional dielectric layer 107.

FIGS. 7A to 7N shows a nonexclusive list of potential shapes of the cross section of said trench 106 in any of the implementations described herein, or in any other implementations.

Table 1 comparing the results of insertion losses and reflections for maximum length of 15λ for the conventional versus our technology as shown in FIGS. 3 to 7.

DETAILED DESCRIPTION OF THE PREFERRED EMBODIMENT

In the following detailed description of the preferred embodiments, reference is made to the appended drawings which form a part hereof, and within which are shown, by way of illustration, specific embodiments by which the invention may be practiced. It is to be understood that other embodiments may be utilized and structural changes may be made without departing from the spirit and scope of the invention. The following detailed description is, therefore, not to be taken in a limiting sense, and the scope of the present inventions is defined only by the appended claims.

Figure 1:
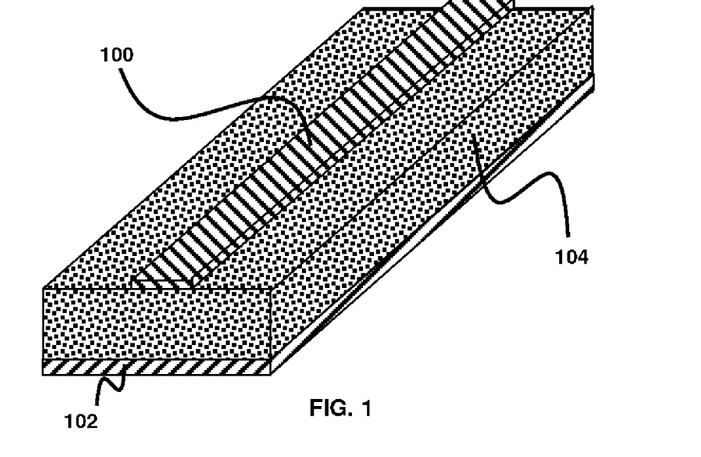
FIG. 1 is a top-side representation of a simple microstrip line, where a dielectric material 104 is used to separate the conductive signal line 100 and the ground plane 102.

A single delay line can be as simple as a straight line such as the line shown in FIG. 1, or more complex, including many bends as shown in FIG. 8A-8D. Multiple delay lines can be chained together as shown in FIG. 8E to create a controlled, variable delay line system at the cost of whatever loss is introduced by the switches.

The structure of each delay line can vary quite significantly. These variances are best illustrated by examining the cross section of the delay line structure where the cross section is perpendicular to the direction of signal propagation. The simplest structure is a microstrip line format, shown in FIG. 1 and FIG. 2A.

FIG. 1 consists of a conducting signal line 100 on top of a dielectric slab 104, with the side of the dielectric slab opposite the conducting signal line 100 covered with a conducting material which operates as the ground plane 102. This arrangement represents the standard microstrip line configuration. A wide variety of more complex structures can fill this roll, some of which can be extrapolated from FIG. 1 through FIG. 6. The key elements that must be present are a conductor suitable for carrying the desired signal at preselected conductor impedance in the direction of propagation, a ground which is separated from the conductor, and a dielectric material to separate the two.

Figure 2A:
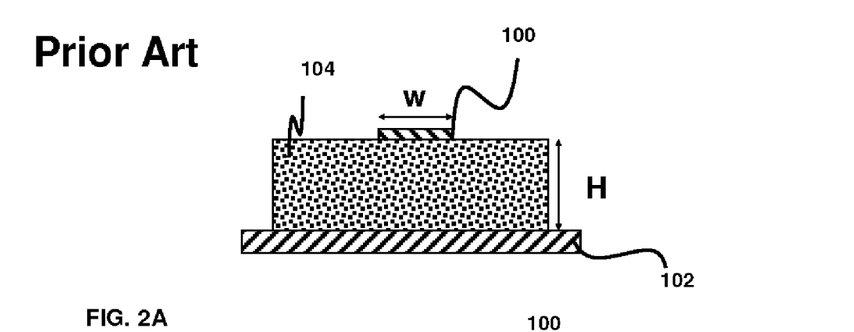
FIG. 2A is a two dimension cross-sectional view, perpendicular to the direction of signal propagation of the transmission line as is shown in FIG. 1.
Figure 2B:
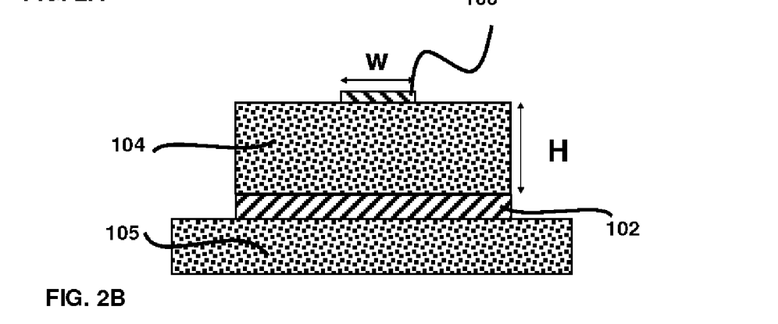
FIG. 2B is a cross section of a transmission line, similar to that from FIG. 2, where the microstrip system is mounted on another dielectric 105 which may or may not be the same as the first dielectric material 104.

FIG. 2A shows the cross section of FIG. 1. FIG. 2B shows a cross section of FIG. 1, but with another dielectric material 105 added underneath the ground plane 102. The new dielectric material 105 may be the same as the core dielectric material 104, or it may be different.

Details of Embodiment (FIG. 3-FIG. 11)

Figure 3A:
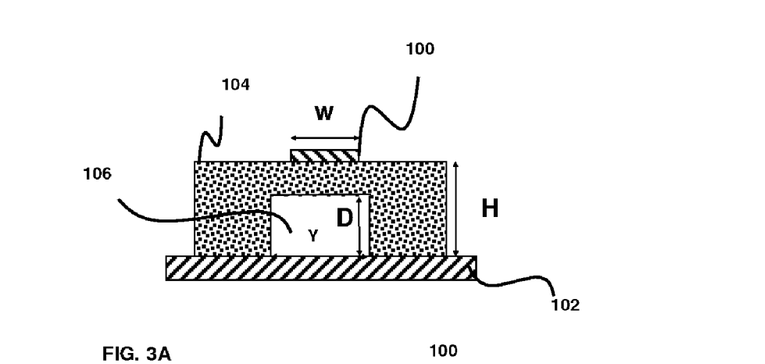
FIG. 3A and FIG. 3B show microstrip configurations similar to those in FIGS. 2A and 2B, but here representing an implementation of the claimed invention, shown by the addition of a trench 106 beneath the signal line 100, where the trench 106 comprises of air, a coolant, or a dielectric with a lower dielectric value than that of the first dielectric material 104 of the same system.

In FIG. 3A, the microstrip line configuration consists of a signal line 100 and a backside ground 102, which are used with a dielectric system 104 with a backside slot 106. The backside slot 106 is filled with the air or a dielectric material (not shown) having lower dielectric loss or constant) than the core dielectric material 104. Introducing the backside-slot filled with air (gas, or liquid) or other dielectric material help to reduce the effective dielectric loss (constant) lower than the main core dielectric material 104. Forming the delay line (phase shifter) with the mentioned structure help to reduce the line insertion loss which is dependent on the backside slot (trench's height). With adjusting of height of trench D to total substrate height H, delay line with microstrip structure having backside slot (filled with air), the effective dielectric loss and effective dielectric constant can be made to ideally zero and 1, close to air's dielectric loss and constant. The trench width Y can be smaller or higher than the signal width W. To capture the fringing field, the trench Y must be higher than the signal line width W. The dielectric can be ceramic, polymer or semiconductor. The dielectric could be any kind of board material such as FR4 (Trade name), Roger, AlN, polymer etc. which can be used to fabricate the delay line (phase shifter) on the board. Semiconductor can also be used, if monolithic delay line (phase shifter) is to be fabricated. The material for the conductor 100 and ground 102 can be copper or other conducting material having high conductivity. The backside slot or trench can be made by laser ablation or etching technique of the dielectric conventionally available.

Figure 3B:
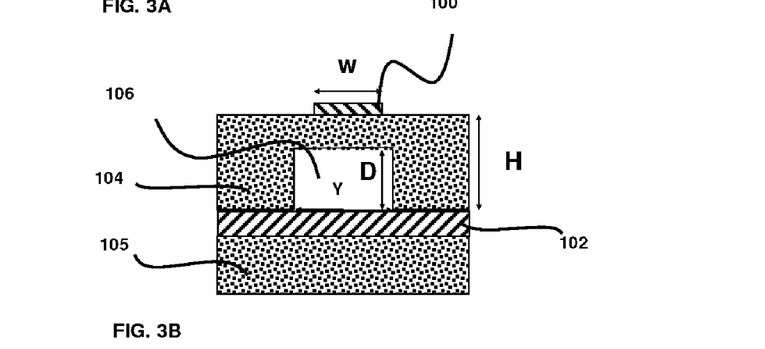

FIG. 3B is the same as FIG. 3A, but with another dielectric material 105 added underneath the ground plane 102. The new dielectric material 105 may be the same as the core dielectric material 104, or it may be different.

This invention allows the dielectric constant and loss-tangent of dielectric systems to be varied as a function of the percentage of dielectric material removed. Assuming a linear variation of the dielectric system's characteristics with dielectric removal, we can calculate the effective loss tangent and effective dielectric constant for the claimed delay line system as a function of percentage removed, using the following expression:

$$\text{Percentage Removed } (R\%) = (D/H)*100 \quad (1a)$$

Where . . .
D: Depth of air gap
H: Height of the substrate
W: Width of Transmission line
T: Thickness of transmission line (½ ounce)
Y: Width of air gap=W+10%

Note: the width of the air gap (Y) is kept more than the width of transmission line (W) in order to overcome the fringing effect.

$$\text{Dielectric Constant} = [((100-R)/100)*4.5] + [(R/100)*1] \quad (1b)$$

The claimed invention therefore takes advantage of the situation described above to increase the bandwidth of traditional delay lines made from microstrip (or stripline) type signal line, by introducing either an air gap or a lower loss dielectric material. In addition, utilizing the different depth of the trench help to tune the delay line as required from the fixed dielectrics.

According to this invention, the effective dielectric loss (loss tangent of dielectric system) can be reduced. The signal attenuation, while attenuating through the signal line, can also be reduced. In other words, signal transmission is less dispersive and a higher bandwidth of the interconnect system is ascertained, compared to the conventional interconnect system where a signal conductor is laid onto a uniform dielectric medium, as shown in FIG. 1-FIG. 2B as prior art examples. Less cross talk is also expected with this invention.

Based on the design, a substantial part of the electromagnetic wave is made to pass through the backside slot 106. The effective dielectric constant is therefore considerably decreased and the signal propagation time can be tremendously reduced. The width of the trench or backside slot 106 can be adjusted based on the width of the signal line 100. The signal line impedance can be controlled by altering the trench 106, the ground 102, and the signal line 100 in various ways.

Figure 4A:
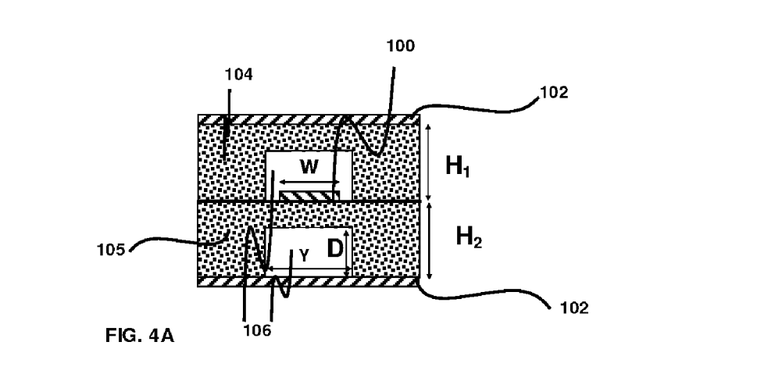
FIG. 4A and FIG. 4B show cross sections of an additional two implementations of the claimed invention where a said trench 106 is above the signal line 100 as well as below it.

FIG. 4A shows an embodiment that implements two ground planes 102, and two dielectric materials (104 and 105), which may or may not be the same. The numeral as mentioned in FIG. 4A are the same as those mentioned in FIG. 3, so that similar explanations are omitted here. According to the invention, a conducing signal line 100 is placed inside of trench or backside slot 106. Underneath the signal line 100 is another dielectric material 105, which also has a trench or backside slot 106 filled with air or a lower dielectric material. This arrangement is commonly referred to as a strip-line configuration. Signal line 100 can be situated onto the dielectric 105, or can be located onto the dielectric 104 in upside down (not shown here). Alternatively, the signal line 100 can be placed on a thin third dielectric (not shown here) which is sandwitched by two dielectrics 104 and 105. The heights $H_1$ and $H_2$ of the dielectrics 104 and 105, respectively can be same or not same, if symmetrical or asymmetrical striplines transmission line are desired. Through drilled or closed drilled can be used to open the trench in dielectrics 104 and 105.

Figure 4B:
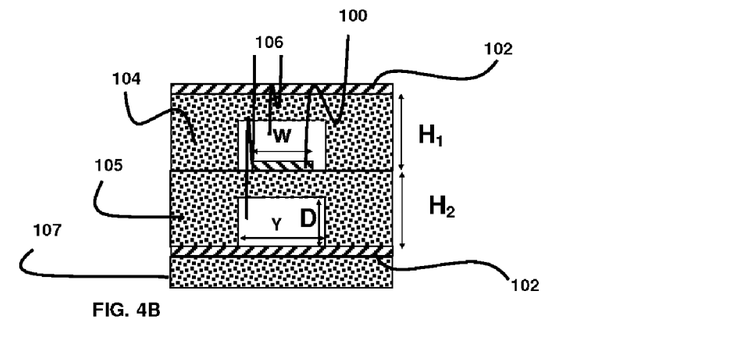

FIG. 4B is the same as FIG. 4A, but with a third dielectric material 107 added underneath one of the ground planes 102. This third dielectric 107 may be the same as either of the other two dielectric materials (104 or 105), or it may be altogether different.

Figure 5A:
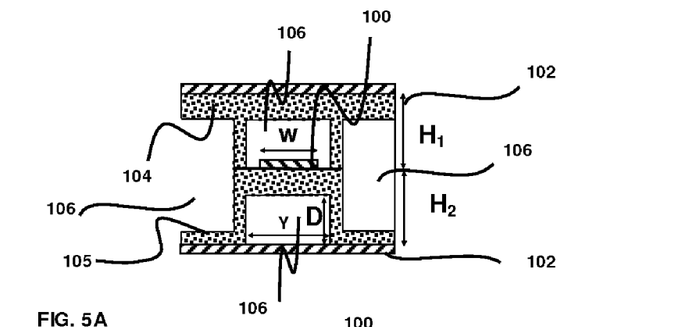
FIG. 5A and FIG. 5B show additional implementations of the claimed invention where a said trench 106 is above, below and to the sides of the signal line 100.
Figure 5B:
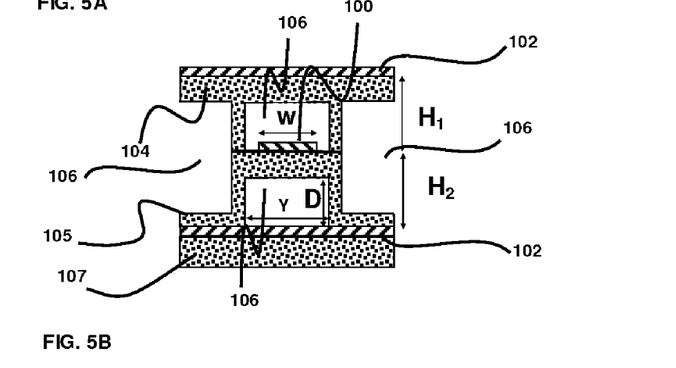

FIG. 5A and FIG. 5B are analogous to FIG. 4A and FIG. 4B, respectively. The difference is that another air gap, called a trench or backside slot, 106, or section of dielectric material having loss-tangent (or dielectric constant) lower than the core dielectric material, is added on either side of the conducting signal line 100. This will allow to reduce the insertion loss further by passing the fringing field (away from the signal line (not shown here) through the low-loss tangent material. Other explanations are same as those, as mentioned in FIG. 4, so that those are omitted here.

Figure 6A:
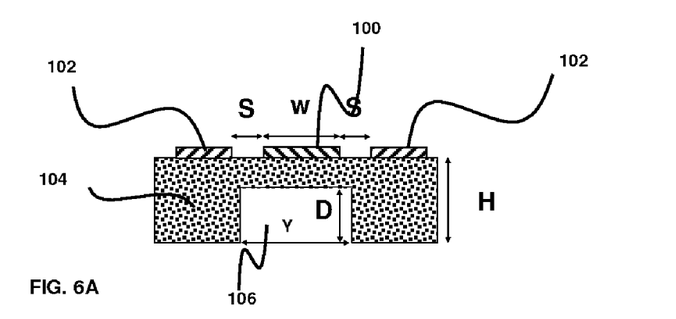
FIG. 6A and FIG. 6B show cross sections of implementations of the claimed invention in co-planar waveguide form.

FIG. 6A is the schematic showing the cross-sectional view of the transmission line alternatively used for delay line (Phase shifter) according to the invention wherein the same numerals mentioned are those mentioned previously, and similar explanations are omitted here. In FIG. 6A, transmission line has a coplanar configuration where two ground planes (non-signal conductive lines) 102 are laid on top of the dielectric material 104 and in the same plane as the signal line 100. Underneath the signal line 100 is still the air gap or section of lower dielectric material 106. Notice no additional ground plane is present underneath the dielectric material 104, although one could be placed there. This arrangement is commonly referred to as a coplanar configuration. The opened-trench underneath the signal lines can be same width as that of the signal line, but the trench-width can also be extended to underneath of the ground plane (not shown here) to capture also the fringe field. The description of the dielectric and way to make the opened-trench, covering this invention are already explained earlier, so that similar explanation is omitted here.

Figure 6B:
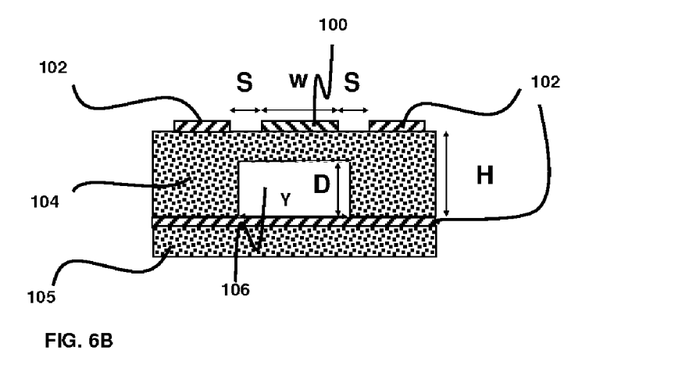

FIG. 6B is similar to FIG. 6A, but adds another ground plane 102 underneath the core dielectric 104. The combination will make the grounded coplanar plane and have an advantage of no or low noise. Another dielectric material 105 underneath the new ground plane 102 can be added to support the ground plane 102 under the opened-trench. This is another variation on the coplanar configuration according to this invention.

This invention is especially groundbreaking because it teaches that any delay line configuration can be improved by lowering the effective dielectric constant through the replacement of portions of the dielectric substrate with air gaps and/or sections of lower dielectric material. In addition, the signal delay (signal phase) can be adjusted by using variable opened-trench at various section along the signal line. The. dielectric materials include all kinds of ceramic materials such as: Duroid, FR4, Kepton (Dupont's Trademark), Pyralux, AlN, Al.sub.2O.sub.3, Mullite (3Al.sub.2O.sub.3: 2SiO.sub.2), SiC, SiO.sub.2, Silcion nitride, silicon carbide, Silicon-Oxy-Nitride, BeO, Cordie-rite (magnesium alumina silicate), BN, Glass (with different compositions), epoxy glass, CaO, MnO, ZrO2, PbO, alkali-halide (e.g. NaBr, NaCl, etc.), BN, BeO, and all kinds of low temperature cofired ceramics etc., and all kinds of the polyimides and benzocyclobutenes (BCBs) having dielectric properties. All kinds of polymer materials having dielectric properties are also included. These dielectric materials can be made using high temperature ceramics processing or using the IC fabrication process. Polymer dielectric materials also include, but not limited to: Teflon, liquid crystal polymer, epoxy, parylene, silicone-polyimide, silicone-gel, and fluorinated ethylene propylene copolymer. Other materials include: materials of elastomers (e.g. silicone elastomer), monomers, and gels. Dielectric materials, which can be made using high temperature ceramics processing or the IC fabrication process, are also included this category. All standard polymers are available from some standard manufacturers, for example: Dupont, Hitachi-Chemical, Mitsui, and Mitsubishi-Chemical Industries. Gore-Tex, Japan markets liquid crystal polymer.

Additional benefits, beyond improved electrical performance can be achieved through the use of a different material for the "filler" dielectric material placed inside of the trench or backside slot 106. One example is to make the "filler" dielectric material a coolant fluid (gas or liquid). The "filler" is added to a sealed loop path designed to allow the "filler" to circulate, such that the "filler" could improve the delay line bandwidth and also provide system cooling. Alternatively, this structure can also be used for cooling the substrate only.

Another distinct benefit can be achieved by providing that the "filler" material be liquid crystals. By designing the layout to create a tunable electrical field across the liquid crystals in the trench or backside slot 106 in any of the figures that is strong enough to align the crystals even when a strong signal is passing through the signal line 100, a finely tunable variation in electrical loss can be created.

Figures 7A, 7B, 7C, 7D, 7E, 7F, 7G, 7H:
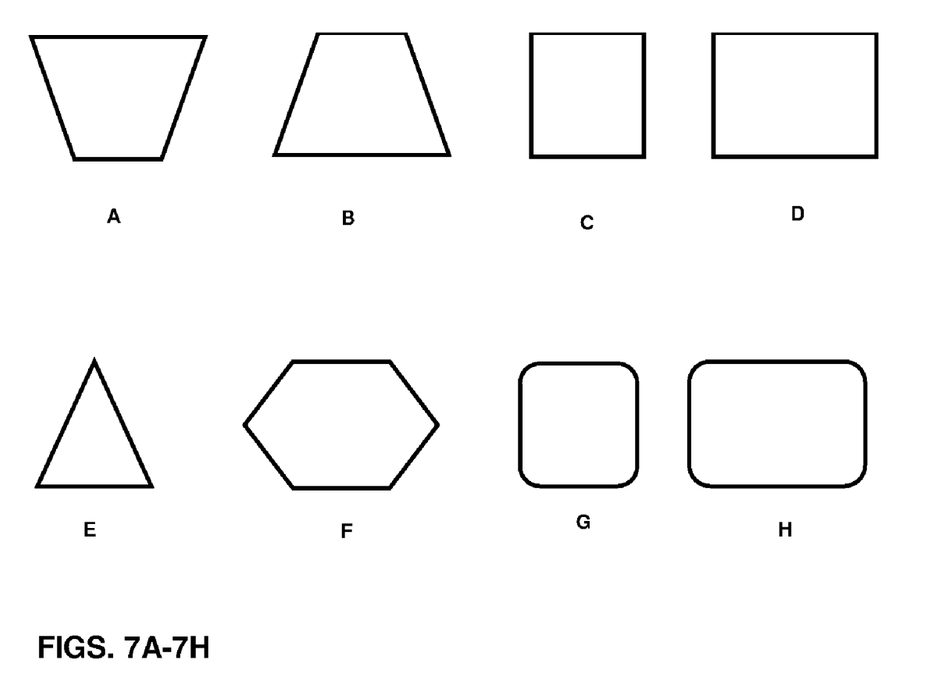
Figures 7I, 7J, 7K, 7L, 7M, 7N:
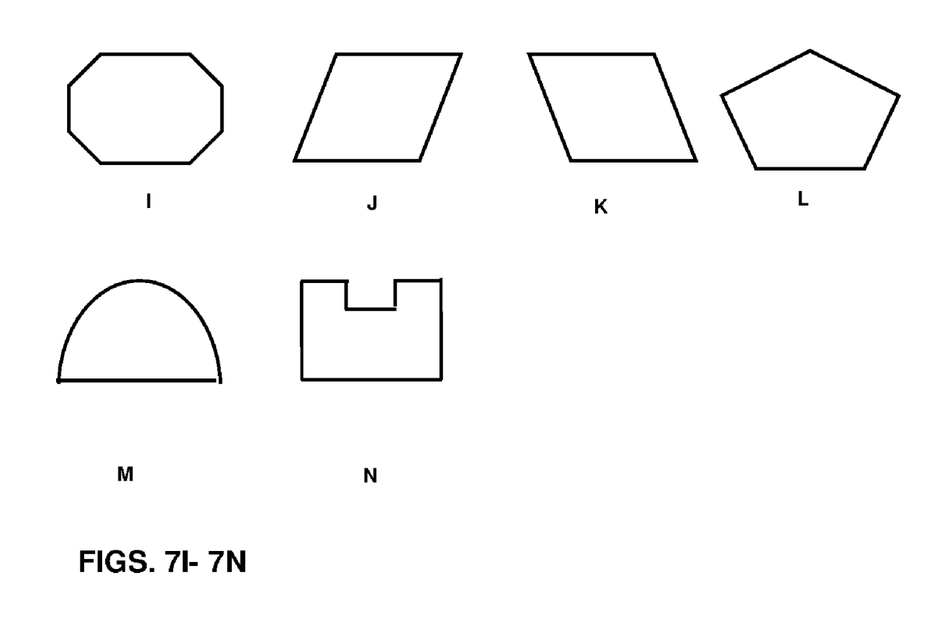

FIG. 7A-7N show various cross-section shapes that may be used for the backside slot 106 in a direction that is perpendicular to the direction of signal propagation in the signal line 100. Various shape of the opened-trench convenient to manufacturing can be used. The shapes as shown in FIG. 7A-7N are the representation of those which could be used.

Delay Line Shape

Figure 8A:
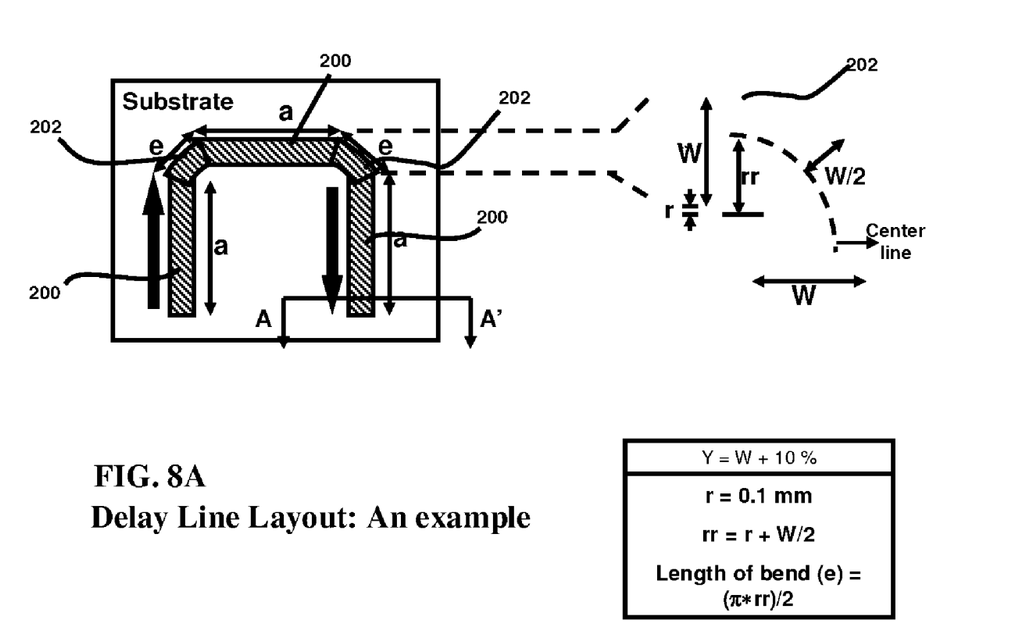
FIGS. 8A, 8B, 8C, and 8D show potential layouts for the microstrip delay line 200 with a bend 202 which could be used with or without the explained implementations of the invention described in FIGS. 3 through 7.

FIG. 8A represents a possible layout for the delay line system. According to this invention, the straight section 200 can be a delay line of any of the aforementioned configurations or variations of the structures. The bend section 202 will be the same, but the geometry will be slightly different as illustrated in FIG. 8A. If W be the width of the signal line of delay-line, the bend as illustrated in FIG. 8, can be obtained considering a fixed radius rr of bending (e.g. W/2+r) and internal radius r can be variable. Length of bending (e) considering the quarter circle, is found to be $(\pi.rr)/2$. Any standard way of technique as noted in standard layout tools, can be used to design the bending portion of the delay-line comprising with the transmission line.

The length of the delay-line mentioned here would determine the signal-delay or phase shifting, and it can be determined as below. For example, the delay lines are designed to achieve delay time ($\tau$) of 0.1 ns, 0.2 ns, 0.4 ns and 0.8 ns for specific frequency or frequencies ranges. If we consider as the phase shifter, then n times of $\lambda$ (wavelength) phase shifting of the signal can be possible by adjusting the electrical length $\lambda$ of the transmission line (i.e. 200 and 202 in FIG. 8A) where n is the positive integer (i.e. n=1, 2, 3 ... etc.).

Figure 8B:
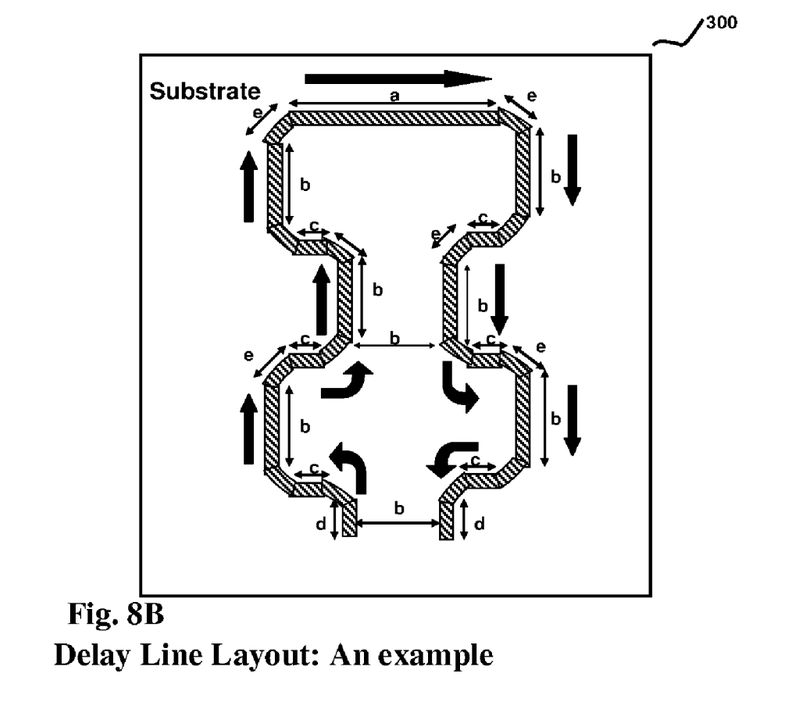
Figure 8C:
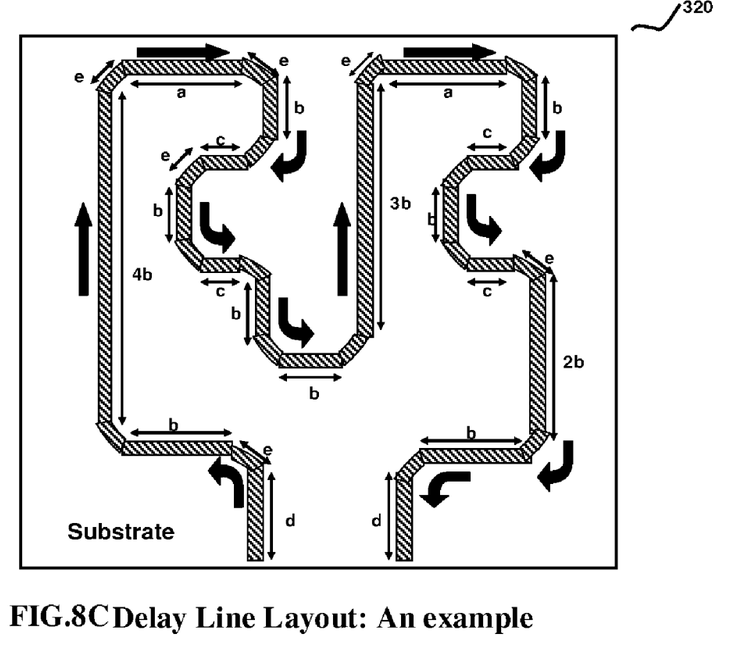
Figure 8D:
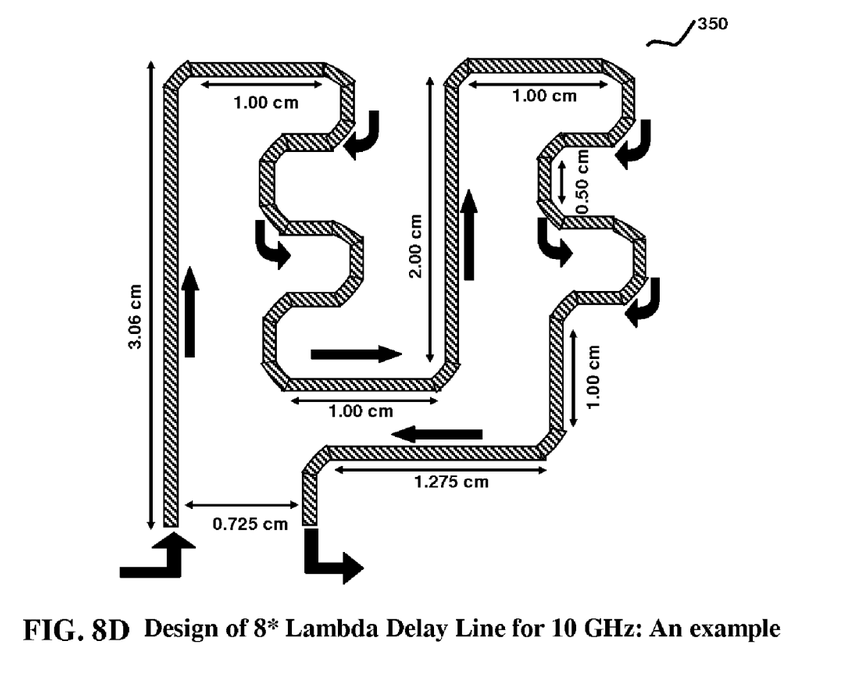

Time delay of the electrical signal in certain media can be expressed by, $$T = L/v_p \quad (2)$$

where L is the length of media (in this case delay line) and $v_p$ is the phase velocity which can be expressed as again, $$v_p = C/(\in_{\mathit{eff}})^{0.5} \quad (3)$$

where, C is the Speed of light, which is $3 \times 10^{10}$ cm/sec, and $\in_{\mathit{eff}}$, the effective dielectric constant of the media for microstrip-type transmission line, which can be expressed as, $$\in_{\mathit{eff}} = [(\in_r + 1)/2] + [(\in_r - 1)/2 * (1/(1 + 12 * H/W))^{0.5}] \quad (4)$$

where $\in_r$ is the relative dielectric constant for the dielectric media. The effective dielectric constant for the structure of explained earlier can be determined from the percentage of the dielectric removal as noted in Eq. 1. For achieving longer signal-delay, and also making the delay line compact, bended portions have to be incorporated in the delay-line. FIGS. 8B and 8C show layout options for the delay line system 300 and 320, respectively. Straight sections (a,b,c,d) can be linked with the bend section (e) in order to form some convenient shape. The electrical length $\lambda$, equivalent to wavelength of the any signal frequency can be designed. FIG. 8D represents an example of a design which would introduce an $8\lambda$ phase shift (8 times the wavelength) for a 10 GHz system 350. All appropriate dimensions are shown. The dielectric substrate considered for designing delay-line shown in FIG. 8D, was FR4 (Trade name) having dielectric constant of 4.5 and loss-tangent of 0.02. The total length of the transmission line, made from specific dielectrics, can be calculated from Eq. 2, once the total signal delay (phase-shifting) is known. Various layouts configurations can be thought as illustrated in FIGS. 8A-8D.

Figure 9:
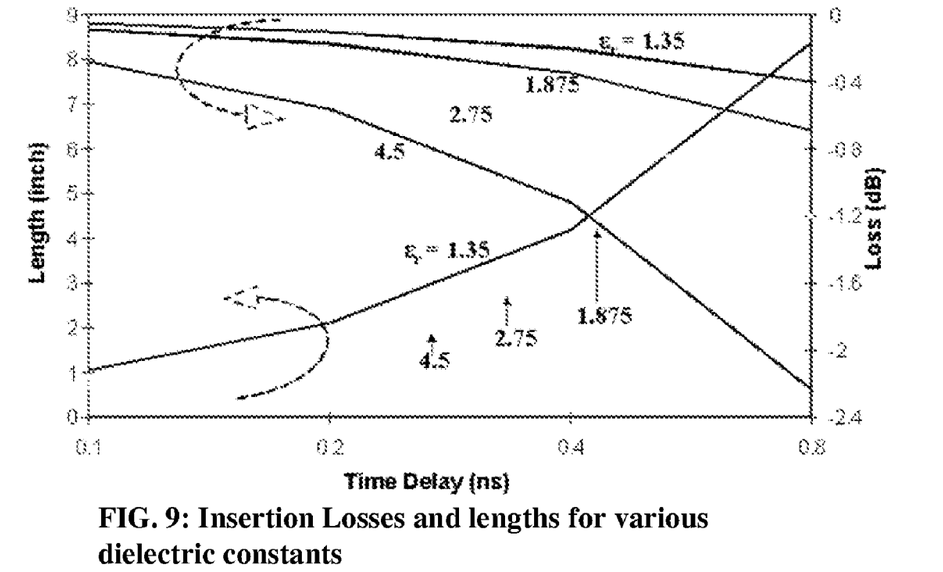
FIG. 9 shows the estimated lengths in inches and corresponding insertion loss as a function of the delay time in nanosecond according to this invention wherein low-cost board material (FR4) is used in simulation as for example. The variation of the dielectric constant (as well as loss-tangent) as shown in FIG. 9 is due to the variation of the opened-trench height considered in the simulation.

By varying the effective dielectric-loss (loss tangent) and constant of the substrate, we are able to get a low insertion loss for longer delay line, as compared to conventional case. To reduce the insertion loss of the delay-line, the dielectric removal would need to be >50% with respect to the total height of the core dielectric material, composing the transmission line. FIG. 9 shows results for various delay lines designed for 0.1 ns, 0.2 ns, 0.4 ns, and 0.8 ns utilizing the conventional FR4, as an example and for various dielectric-removals. Noted here that, dielectrics constants shown in FIG. 9 are estimated from the percentage of dielectrics removal under the signal lines. For 0% removal, the dielectric constant is 4.5 (FR4 dielectric constant) and for 90% removal, the dielectric constant is 1.35. As shown in FIG. 9, the insertion loss (S21) is reduced to 0.7 dB with 75% removal as compared to 2.2 dB with conventional for 0.8 ns delay line. S21 even reduces to 0.4 dB when the depth (D) is 90% removed.

Figure 10:
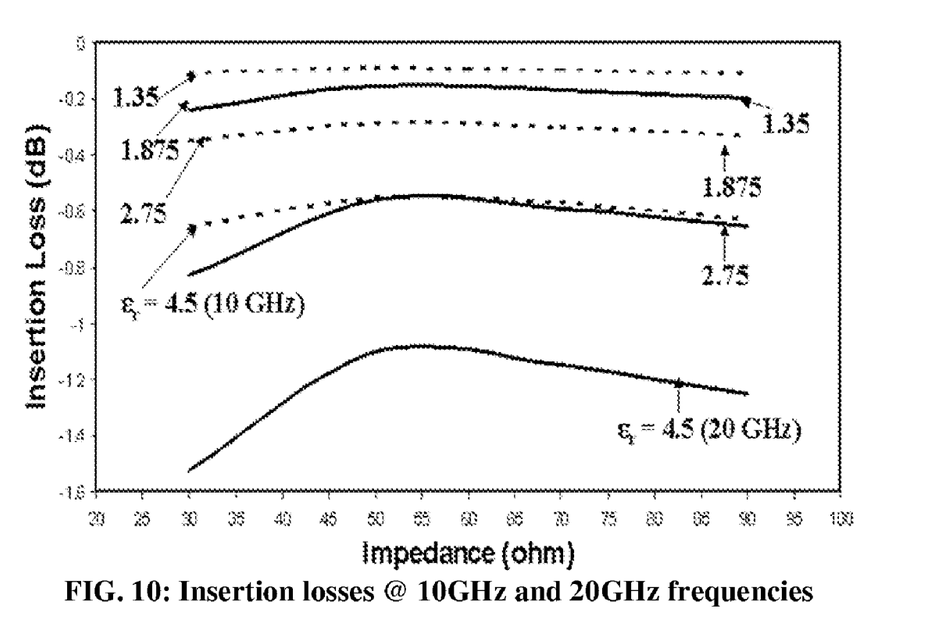
FIG. 10 shows the estimated insertion loss variation as a function of the characteristic impedance variation for fixed length of dely-line. 10 GHz and 20 GHz signals are considered as for an example in the simulation.

Insertion loss due to different characteristics impedances for the specific delay line cases are also plotted for various percentage of removal, and it is shown in are FIG. 10. Noted here that the results are for various characteristics impedances (30Ω, 50Ω, 70Ω, and 90Ω), carried out considering the source (input port) and receiver (output port) impedance 50Ω. The increase of insertion loss due to the various line-impedances other than 50Ω is due to increase of the reflection loss. The higher the frequency, the higher the insertion loss for 0% removal case (conventional type) as compared with higher dielectric removal (R) cases. The insertion loss variation due to various line impedances gets smaller with decreasing of the percentage removal and this is largest for 0% dielectric removal (conventional type).

Figure 11A:
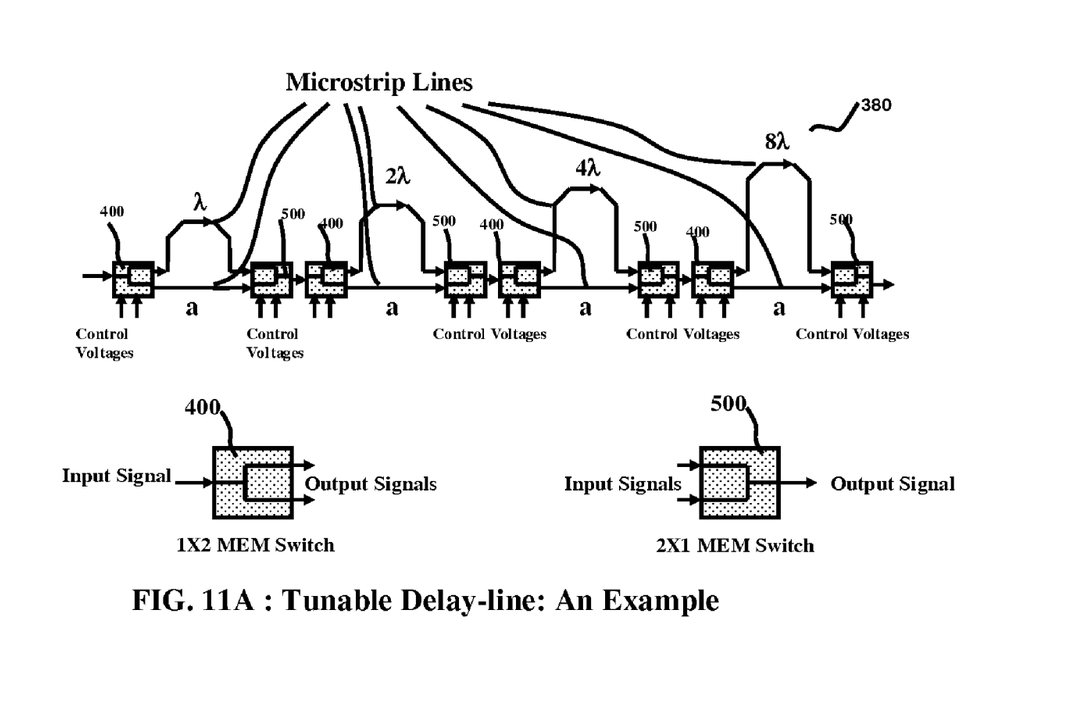
FIGS. 11A, 11B, and 11C show how different length delay lines can be connected with dual throw, or higher, switches (400 and 500) to create a variable delay line where the application of the explained implementations can reduce the loss of the system.

Connecting various lengths of the delay-line with switches will help to make variable (tunable) delay-line (phase shifter) system. FIG. 11A illustrates how one can use the different designs of the delay line system (FIG. 8A-FIG. 8D for example) to construct a tunable delay line system 380. A 1×2 (single-pole double-throw) MEM (micro-electro-mechanical) switch 400 and a 2×1 (double-pole single-throw) MEM switch 500 are used to tune the system to the desired delay time (phase shift). By opening some switches or keeping some switches closed, one should be able to tune the introduced phase shift from 0λ to 15λ if four fixed delay lines having electrical lengths of λ, 2λ, 4λ, and 8λ are connected in series, as shown in FIG. 11A. The variable delay line can be operated either in analog or digital ways. To operate in analog way, any number of the delay line of any length can be used. To operate in Digital way (bit-wise), total number of stages required to connect is equal to m, which is equal to number of desired bit. Each segment has the specific fixed electric length of $X=(2^{(k-1)})\lambda$ wherein λ is the electrical wavelength, X is the length of delay lines per stage and k is the $k^{th}$ number of stages.

Figure 11B:
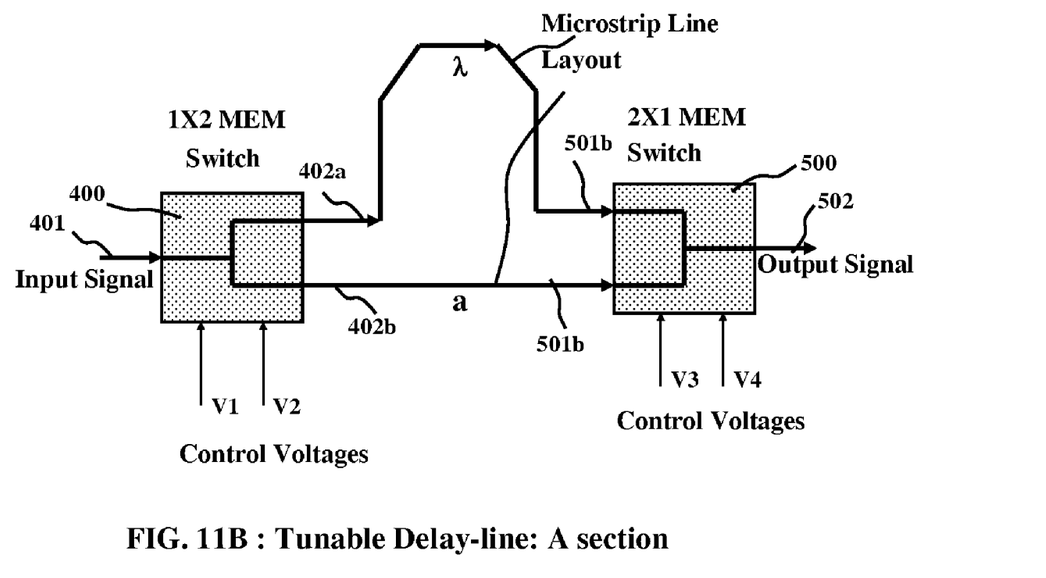

To connect in series, at least one 1×2 switch 400 and at least one 2×1 500 switch are required for each delay line. FIG. 11B is a close up of one of the sections illustrated in FIG. 11A. The 1×2 switch 400 has one input 401 and two outputs 402a and 402b and it is connected in input side of the delay line. The 2×1 switch 500 has two inputs 501a and 501b and one output 502, and it is connected to output of each delay line. The 1×2 MEM switch 400 is able to switch between sending the signal straight through or sending it through the longer delay line, introducing a phase shift (in this case of one lambda). The MEM switch can be fabricated using standard Si-MEM technology, and can be operated using the voltage-source, inserting on or off of the voltage applied in the terminal for connecting or disconnecting the terminal.

Figure 11C:
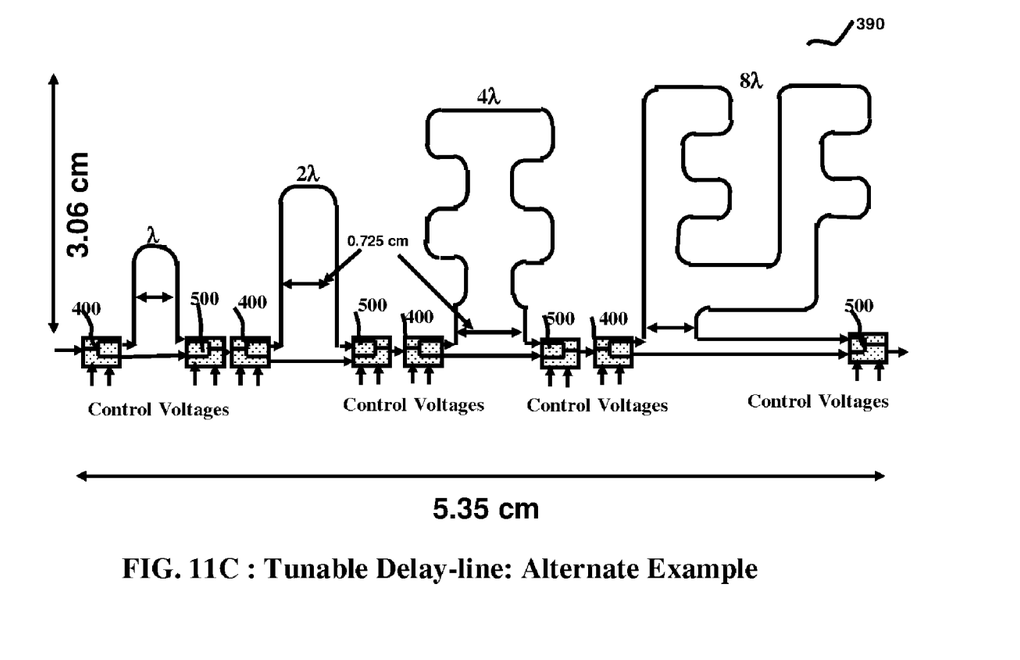

The variable delay line system of m-bit can be possible, and to make the compact of the delay-line, suitable configuration of the delay line can be used. FIG. 11C represents an example of an entire tunable system 390 put to use. It illustrates the small size of the entire system. Depending on how the switches are configured, the signal may pass straight through, or may receive anywhere from a zero λ-15λ phase shift, and digitally can be made to 4-bit tunable delay-line (phase-shifter). FR4 board material with using opened-trench, as explained earlier, are considered in the example as shown FIG. 11C. Table 1 compares the performances of delay-lines made from conventional board material (i.e. FR4) and proposed techniques, mentioned in this invention.

Figure 12A:
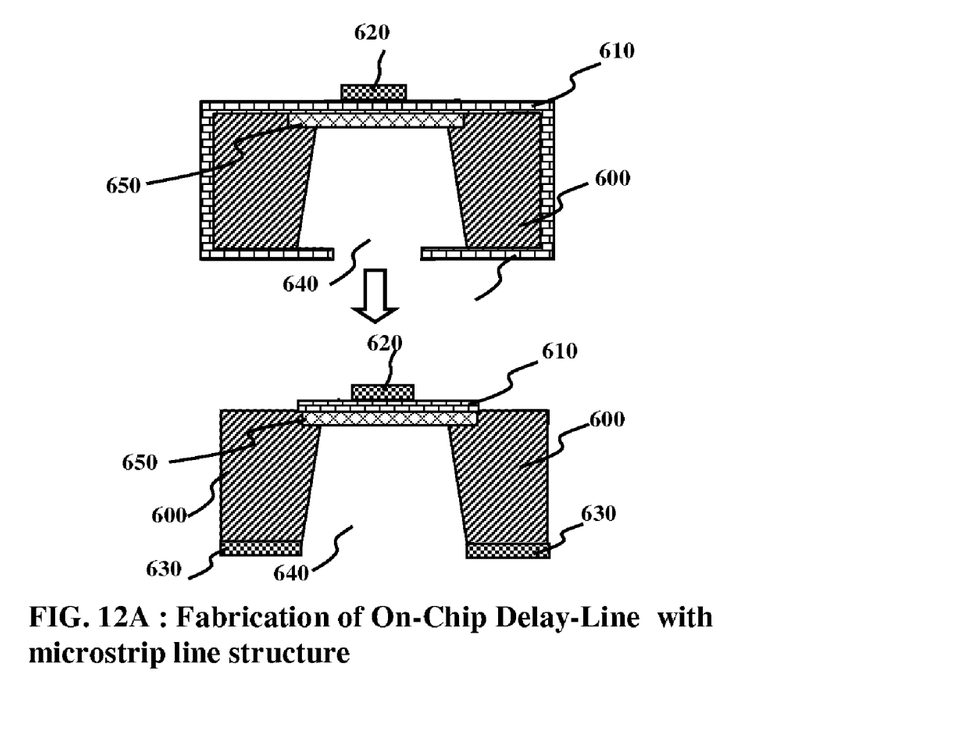
FIGS. 12A and 12B show the fabrication process of the on-chip delay line with microstrip line and coplanar waveguide structures according to this invention, wherein cross-sectional views are only shown and it can be implemented in the tunable delay-lines on-chip with any of the configurations as shown in FIG. 11 wherein the length of each delay line segment is based on the substrate electrical properties.
Figure 12B:
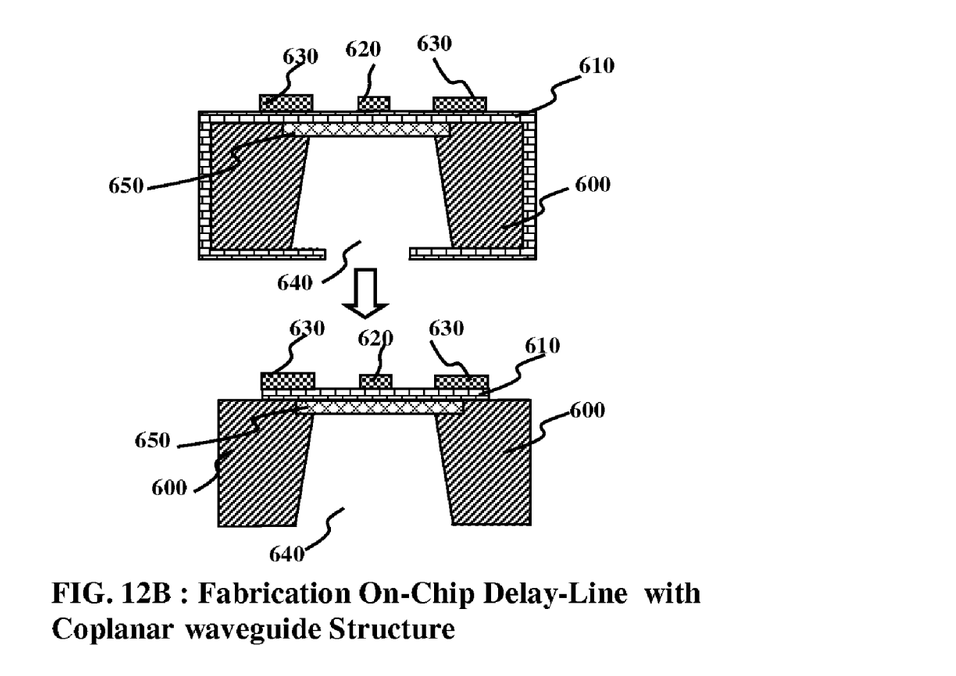
Figure 12C:
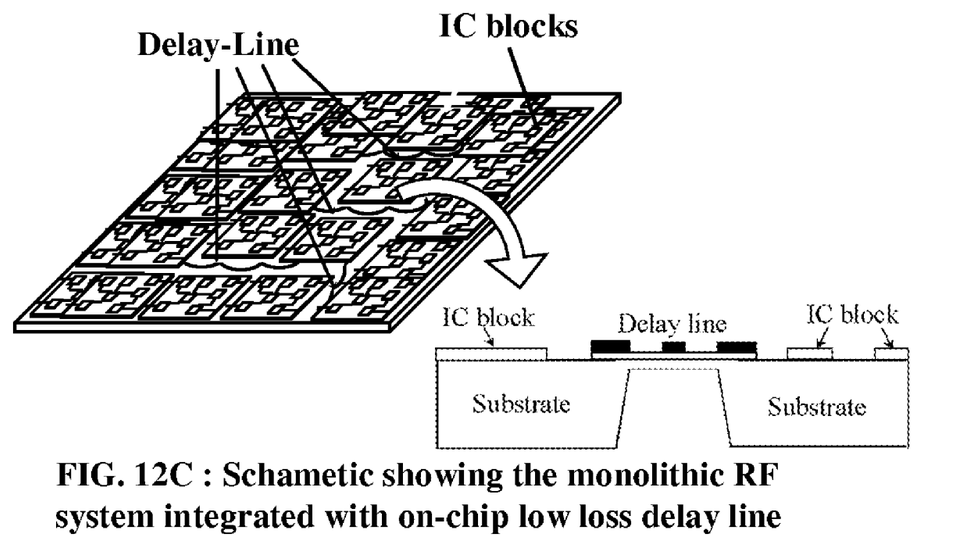
FIG. 12C shows a schematic showing the monolithically integrated low-loss delay line with other components.

The present invention covers the delay-lines made on the (a) semiconductor and also (b) printed circuit board. Using semiconductor to fabricate delay-line, disclosed here, will help to integrate with other IC (integrated circuit) for operation or increasing the functionalities. FIGS. 12A and 12B are the cross-sectional views showing the fabrication process of the on-chip delay line with microstrip line and coplanar waveguide structures as for examples. The proposed delay line can be fabricated using standard IC process technology. For fabricating delay line on any semiconductor (e.g. silicon (Si)), substrate 600, standard wet-etching or dry etching process can be used. For Si case, KOH or EDP (Ethylene Diamine Pyrocatechel) can be used as the wet-etchant. After coating with insulator layer 610 such as $SiO_2$ or $Si_3N_4$, metallization and subsequent patterning make the signal line 620 and ground 630. This is followed by the wet-etching process to open the trench 640 from the backside of the substrate 600 and afterwards wet-etching of insulator layer 610. Highly doped Boron (into Si) can be used as the etch-stopper 650. For simplicity, Si is considered as the substrate, but the delay line utilizing this invention can also be used for other type of semiconductor such as GaAs, InP, SiC, GaN, or any Semi-insulating substrate. As submicron-meter level fabrication process can be controlled in standard CMOS technology, high precision delay line can also be fabricated for the fixed or tunable delay-time. Making delay-line on semiconductor help to integrate with other components, as shown in FIG. 12C, such as MEM switch, power supplies, etc. as required to enhance the functionality, compact, yet to be low-cost.

The disclosed delay line can also be made on the PCB and it can be helpful in RF system applications where board is used to connect with other component for example phased-array antenna.

It will be understood by those skilled in the art that the foregoing is merely illustrative of the principles of this invention, and that various modifications can be made by those skilled in the art without departing from the scope and spirit of the invention. The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A delay line comprising:
   at least one conducting line including at least one straight section and in continuation with the straight section, at least one bend section, wherein an electrical signal propagates along the axis of the conducting line in each section,
   at least one dielectric region, wherein at least one flat surface of the dielectric region supports the conducting line;
   at least one non-signal propagating conductive surface bordering the dielectric region such that the dielectric region is interposed between the conductive surface and the conducting line; and
   a second dielectric region of a predetermined shape disposed within the dielectric region wherein, the second dielectric region is one selected from a group consisting of a void, a dielectric material, and a desired combination thereof, such that the dielectric constant of said second dielectric region is less than the dielectric constant of the dielectric region.

2. The delay line according to claim 1 wherein said second dielectric region is proximal to the conductive surface and is centered with respect to said conducting line.

3. The delay line according to claim 1 wherein said dielectric material is one selected from a group consisting of a polymer, a ceramic and a semiconductor.

4. The delay line according to claim 1 wherein said void in the second dielectric region is filled up or coated with a liquid crystal polymer such that the dielectric constant (or dielectric loss) of the second dielectric region exhibits tunability.

5. The delay line according to claim 1 wherein cross section of the second dielectric region in a direction perpendicular to the direction of the signal propagation, is one selected from a group consisting of a rectangle and a half-circle.

6. The delay line according to claim 1 wherein said dielectric region includes a material selected from a group consisting of a polymer, a semiconductor, silicon, silica, and ceramic.

7. The delay line according to claim 1 wherein said dielectric region completely surrounds the second dielectric region on all sides.

8. The delay line according to claim 1 wherein said second dielectric region further includes a sealed loop path for circulating a coolant fluid that is a liquid or a gas.

9. A series of delay lines comprising two or more stages, each stage further including:
   a first switch,
   two delay lines, including a first delay line of a baseline length and a second delay line of some longer length than the baseline length, and wherein the inputs of the first and second delay lines are connected to a respective output of the first switch, and
   a second switch, wherein the outputs of the first and second delay lines are connected to a respective input of the second switch;
   an output of the second switch of each stage is connected to an input of a first switch of a following stage such that, each stage is connected to the next stage;
   wherein the lengths of said delay lines in each stage vary to allow selection of $(2^{(k-1)})\lambda$ different delays, wherein $\lambda$ is the length of delay lines per stage and k is the number of $k^{th}$ stages; and
   each first and second delay lines in each stage further including:
      at least one conducting line surrounded in part or in whole by a dielectric d1;
      at least one non-signal conductive surface of any shape and size bordering some part of d1, and an area of any shape inside of or bordering d1 called d2, comprising any material, void, or combination of material and void wherein the dielectric constant of said d2 is less than the dielectric constant of d1.

10. The series of delay lines according to claim 9 assembled in to a tunable delay line system comprising:
    a beginning stage
    at least one middle stage
    an ending stage wherein said stages are connected together, and wherein the longer length delay lines in the middle stage and the ending stage is twice as long as the longer length delay lines of the stage immediately before.

11. The tunable delay line system according to claim 10 wherein said switches may be controlled to allow a signal to pass through without any phase shift being imparted by the switches.

12. The tunable delay line system according to claim 10 wherein said switches are a combination of switches selected from a group consisting of one input and multiple output switches and one output and multiple input switches.

13. The delay line according to claim 1, wherein the first dielectric region is a semiconductor that further includes one or more integrated circuits disposed thereon such that, and the delay line is disposed alongside the integrated circuits.

14. The delay line according to claim 1, wherein the dielectric constant of the first dielectric region is larger than the dielectric constant of the second dielectric material.

15. The delay line according to claim 1, wherein the conducting line is disposed in a coplanar geometry.

16. The delay line according to claim 1 further including:
    a third dielectric region overlying the first dielectric region, wherein the third dielectric region further includes a volume of predetermined shape that is one selected from a void, the second dielectric material, and a desired combination thereof, such that the dielectric constant of the volume is less than the dielectric constant of the third dielectric region;
    a second one of a non-signal propagating conducting surface overlying the third dielectric region, such that the conducting line centrally aligned with the second dielectric region and the volume within the third dielectric region along a common axis, bound by the first and second non-signal propagating conducting surfaces, forms a stripline delay line.

17. The stripline delay line according to claim 16 wherein the first and third dielectric regions proximal to the conducting line are reduced substantially, such that the first and third dielectric regions form thin vertical walls along the direction of signal propagation in the conducting line.

18. The series of delay lines according to claim 9, wherein the delay lines include one or more straight sections in continuation with one or more bend sections, wherein the signal in the conducting line propagates along the axis of the conducting line in each section.

19. The series of delay lines according to claim 9, wherein the dielectric constant of d1 is larger than the dielectric constant of the material in d2.

20. The series of delay lines according to claim 9, wherein said d1 includes a material selected from a group consisting of a polymer, a semiconductor, silicon, silica, and ceramic.

21. The series of delay lines according to claim 9, wherein said d2 includes a material that is one selected from a group consisting of a polymer, a ceramic and a semiconductor.

22. The series of delay lines according to claim 9, wherein said d2 is proximal to the conductive surface and is centered with respect to said conducting line.

23. The series of delay lines according to claim 9, wherein said void in the d2 is filled up or coated with a liquid crystal polymer such that dielectric constant (or dielectric loss) of the d2 exhibits tunability.

24. The series of delay lines according to claim 9, wherein said d2 further includes a sealed loop path for circulating a coolant fluid that is a liquid or a gas.

25. The series of delay lines according to claim 9, wherein the conducting lines in one or more stages are arranged to be in a coplanar configuration.

* * * * *